United States Patent
Chang et al.

(10) Patent No.: US 8,034,712 B2
(45) Date of Patent: Oct. 11, 2011

(54) METHOD OF FABRICATING DUAL DAMASCENE STRUCTURE

(75) Inventors: Kuang-Yeh Chang, Hsinchu (TW); Hong Ma, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/897,073

(22) Filed: Oct. 4, 2010

(65) Prior Publication Data
US 2011/0021021 A1    Jan. 27, 2011

Related U.S. Application Data

(62) Division of application No. 11/623,570, filed on Jan. 16, 2007, now Pat. No. 7,838,415.

(51) Int. Cl.
*H01L 21/4763* (2006.01)

(52) U.S. Cl. ........ 438/637; 438/638; 438/653; 438/424; 438/436

(58) Field of Classification Search .................... 438/637
See application file for complete search history.

(56) References Cited

U.S. PATENT DOCUMENTS

| | | | |
|---|---|---|---|
| 6,472,306 B1* | 10/2002 | Lee et al. | 438/623 |
| 6,924,228 B2 | 8/2005 | Kim et al. | 438/636 |
| 2001/0021581 A1* | 9/2001 | Moon et al. | 438/637 |
| 2001/0030169 A1 | 10/2001 | Kitagawa et al. | 216/17 |
| 2004/0175932 A1* | 9/2004 | Kim et al. | 438/637 |
| 2004/0219796 A1* | 11/2004 | Wu | 438/709 |
| 2006/0194426 A1* | 8/2006 | Yang et al. | 438/618 |
| 2006/0286793 A1* | 12/2006 | Lin et al. | 438/637 |
| 2007/0082477 A1* | 4/2007 | Naik et al. | 438/622 |

OTHER PUBLICATIONS

Chinese Examination Report of Taiwan Application No. 096116278, dated May 30, 2011.

\* cited by examiner

*Primary Examiner* — Steven Loke
*Assistant Examiner* — Kimberly M Thomas
(74) *Attorney, Agent, or Firm* — J.C. Patents

(57) ABSTRACT

A method of fabricating a dual damascene structure is described. A dielectric layer and a metal hard mask layer are sequentially formed on a substrate having thereon a conductive layer and a liner layer. The metal hard mask layer and the dielectric layer are patterned to form a via hole exposing a portion of the liner layer. A gap-filling layer is filled in the via hole, having a height of ¼ to ½ of the depth of the via hole. A trench is formed in the metal hard mask layer and the dielectric layer. The gap-filling layer is removed to expose the portion of the liner layer, which is then removed. A metal layer is formed filling in the via hole and the trench, and then the metal hard mask layer is removed.

6 Claims, 15 Drawing Sheets

METHOD OF FABRICATING DUAL DAMASCENE STRUCTURE

CROSS-REFERENCE TO RELATED APPLICATION

This application is a divisional application of and claims the priority benefit of U.S. application Ser. No. 11/623,570, filed on Jan. 16, 2007, now allowed. The entirety of the above-mentioned patent application is hereby incorporated by reference herein and made a part of this specification.

BACKGROUND OF THE INVENTION

1. Field of Invention

The present invention relates to an integrated circuit (IC) interconnect process, and more particularly to a method of fabricating a dual damascene structure.

2. Description of Related Art

As the integration degree of semiconductor device is increased, multilevel metal interconnect is used widely. When the resistance of the metal of a metal interconnect is lower, the reliability and the performance of the device are generally higher. Since copper has a relatively low resistance among various metal materials, it is suitably used in a multi-level metal interconnect. However, copper is difficult to etch, so that a Cu-interconnect structure is usually formed with a dual damascene process.

In a dual damascene process, a trench and a via hole are formed in a dielectric layer, and then metal is filled in them to form a metal line and a via plug. FIGS. 1A-1C illustrate a process flow of fabricating a dual damascene structure in the prior art.

Referring to FIG. 1A, a dielectric layer 106 and a silicon nitride (SiN) layer 107 are formed over a substrate 100 with a metal layer 102 and a liner layer 104 thereon. Then, lithography and etching are performed to form, in the SiN layer 107 and the dielectric layer 106, a via hole 108 that exposes a portion of the liner layer 104.

Referring to FIG. 1B, another lithography-etching process is conducted to form in the dielectric layer 106 a trench 110 connected with the via hole 108, and then the portion of the liner layer 104 exposed in the via hole 108 is removed.

Referring to FIG. 1C, a metal material is formed over the substrate 100, filling in the trench 110 and the via hole 108 and covering the SiN layer 107. Then, a chemical mechanical polishing (CMP) step is conducted with the SiN layer 107 as a polishing stop layer to remove the metal material on the SiN layer 107 and form a dual damascene 112.

The above dual damascene process has some problems. Referring to FIGS. 1A-1B, for the liner layer 104 in the via hole 108 is damaged by the etchant in the trench etching, the metal layer 102 is easily exposed degrading the electrical properties. The SiN layer 107 and the dielectric layer 106 are also easily damaged by the etchant in the trench etching so that the top corner of the trench 110 is rounded. Thus, bridging is easily caused between two adjacent dual damascene structures 112, as shown in FIG. 2.

SUMMARY OF THE INVENTION

Accordingly, this invention provides a method of fabricating a dual damascene structure that can prevent rounding of the top corner of the trench and thereby prevents bridging between two adjacent dual damascene structures.

This invention also provides a method of fabricating a dual damascene structure that can prevent the liner layer from being damaged by the etchant in the trench etching.

A method of fabricating a dual damascene structure is described. A substrate having a conductive layer and a liner layer thereon is provided. A dielectric layer, a metal hard mask layer and an antireflection layer are sequentially formed on the liner layer and then patterned to form, in the dielectric layer, a via hole that exposes a portion of the liner layer. A gap-filling layer is filled in the via hole and then the antireflection layer, the metal hard mask layer and the dielectric layer are patterned to form a trench connected with the via hole. The gap-filling layer is removed, and then the liner layer in the via hole is removed with the antireflection layer as a mask. A metal layer is formed filling in the trench and via hole, and then the antireflection layer and the hard mask layer is removed.

According to the embodiments of this invention, the above gap-filling material may be a photosensitive polymer or a non-photosensitive polymer.

In an embodiment, the gap-filling layer is formed by filling in the via hole a material layer having a height higher than a predetermined height of ¼ to ½ of the depth of the via hole and then conducting etching-back to remove a portion of the material layer such that the remaining material layer has the predetermined height.

In an embodiment, the steps of forming the trench and removing the gap-filling layer include forming a patterned photoresist layer on the antireflection layer, etching the antireflection layer, the hard mask layer and the dielectric layer with the photoresist layer as a mask to form the trench and then removing the gap-filling layer and the photoresist layer simultaneously. In etching the antireflection layer, the metal hard mask layer and the dielectric layer, the etching selectivity of the dielectric layer to gap-filling layer may range from 0.5 to 1.5 as the dielectric layer is being etched. The step of removing the gap-filling layer and photoresist layer simultaneously may utilize oxygen-plasma ashing.

In addition, the material of the metal hard mask layer may be selected from titanium (Ti), tantalum (Ta), tungsten (W), titanium nitride (TiN), tantalum nitride (TaN), tungsten nitride (WN) and their combinations.

In an embodiment, the gap-filling layer has a height of ¼ to ½ of a depth of the via hole.

Another method of fabricating a dual damascene structure is described below. A substrate having a conductive layer and a liner layer thereon is provided, a dielectric layer is formed on the liner layer, and then a cap layer and a metal hard mask layer are formed on the dielectric layer. The hard mask layer, the cap layer and the dielectric layer are patterned to form, in the dielectric layer, a via hole that exposes a portion of the liner layer, and then a gap-filling layer is filled in the via hole. A trench is formed in the dielectric layer connected with the via hole, and then the gap-filling layer is removed. The liner layer in the via hole is removed with the metal hard mask layer as a mask, and then a metal layer is formed filling in the trench and the via hole. The metal hard mask layer is then removed.

In some embodiments of the above method, the above gap-filling material may be a photosensitive polymer or a non-photosensitive polymer.

In some embodiments of the above method, the gap-filling layer may have a height of ¼ to ½ of the depth of the via hole.

In some embodiments, the steps of forming the trench and removing the gap-filling layer include forming a patterned photoresist layer on the metal hard mask layer, etching the metal hard mask layer, the cap layer and the dielectric layer with the patterned photoresist layer as a mask to form the trench, and removing the photoresist layer and the gap-filling layer simultaneously. In etching the metal hard mask layer, the cap layer and the dielectric layer, the etching selectivity of the dielectric layer to the gap-filling layer may range from 0.5 to 1.5 as the dielectric layer is being etched. The step of removing the gap-filling layer and photoresist layer simultaneously may utilize oxygen-plasma ashing.

In some embodiments, the material of the cap layer may be silicon oxide (SiO), silicon nitride (SiN), silicon carbonitride (SiCN), silicon carbide (SiC) or silicon oxy-nitride (SiON). The material of the metal hard mask layer may be selected from Ti, Ta, W, TiN, TaN, WN and their combinations.

In some embodiments, the metal hard mask layer is formed on the cap layer. The step of removing the metal hard mask layer includes a CMP step with the cap layer as a polishing stop layer.

In some embodiments, the metal hard mask layer is formed on the cap layer and an additional cap layer is formed on the metal hard mask layer. The additional cap layer is removed before the metal hard mask layer is removed. The step of removing the metal hard mask layer and the additional cap layer includes a CMP step with the cap layer as a polishing stop layer.

In some embodiments, the cap layer is formed on the metal hard mask layer and is removed before the metal hard mask layer is removed.

Since a gap-filling layer is formed on the liner layer in the via hole before the trench is formed, the liner layer is not damaged in the trench etching so that the underlying conductive layer is not damaged and degraded. Meanwhile, the etching selectivity of the dielectric layer to the metal hard mask is very high, so that the trench top corner is not rounded and bridging of two adjacent damascene structures is avoided.

In order to make the aforementioned and other objects, features and advantages of the present invention comprehensible, a preferred embodiment accompanied with figures is described in detail below.

DESCRIPTION OF EMBODIMENTS

First Embodiment

FIGS. 3A-3F illustrate, in a cross-sectional view, a process flow of fabricating a dual damascene structure according to the first embodiment of this invention.

Figure 1A:
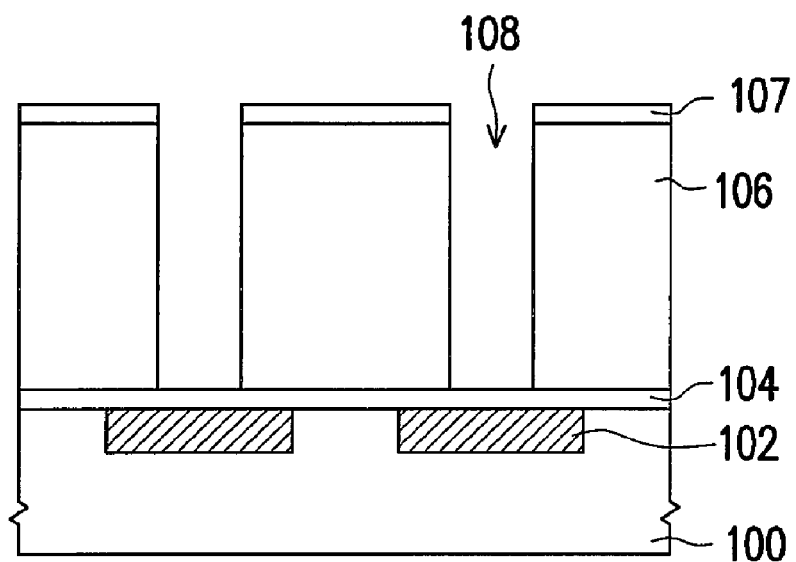
FIGS. 1A-1C illustrate, in a cross-sectional view, a process flow of fabricating a dual damascene structure in the prior art.
Figure 1B:
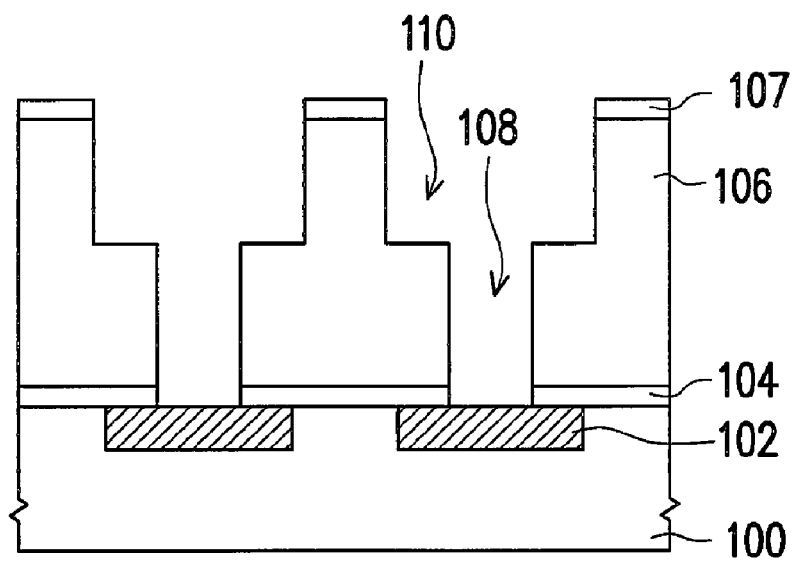
Figure 1C:
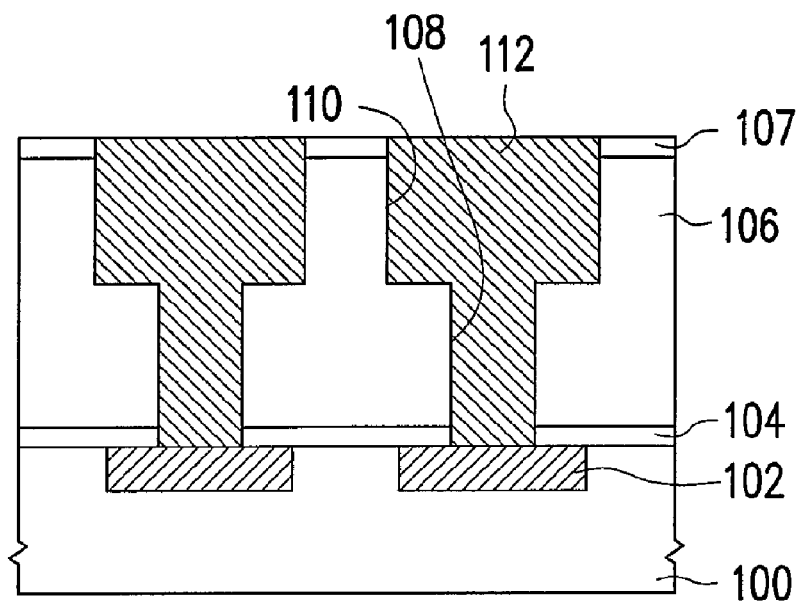
Figure 2:
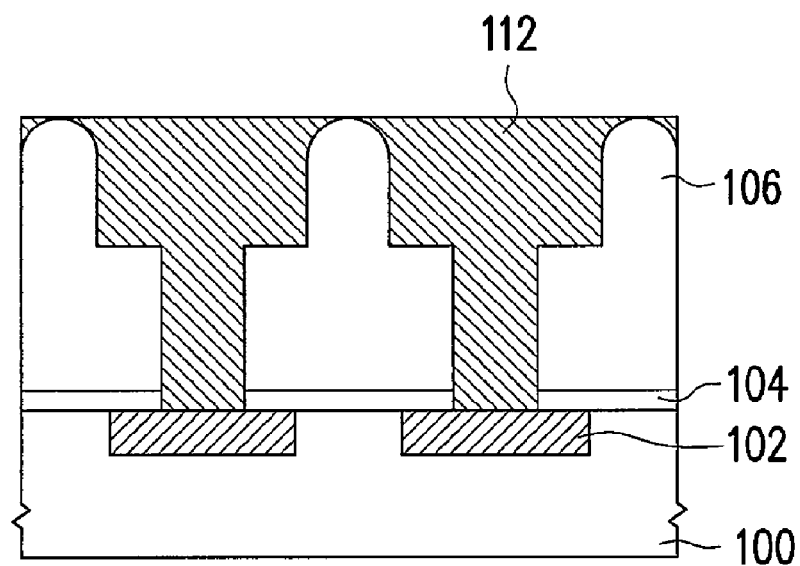
FIG. 2 illustrates the bridging between two adjacent dual damascene structures with rounded trench top corners in the prior art.
Figure 3A:
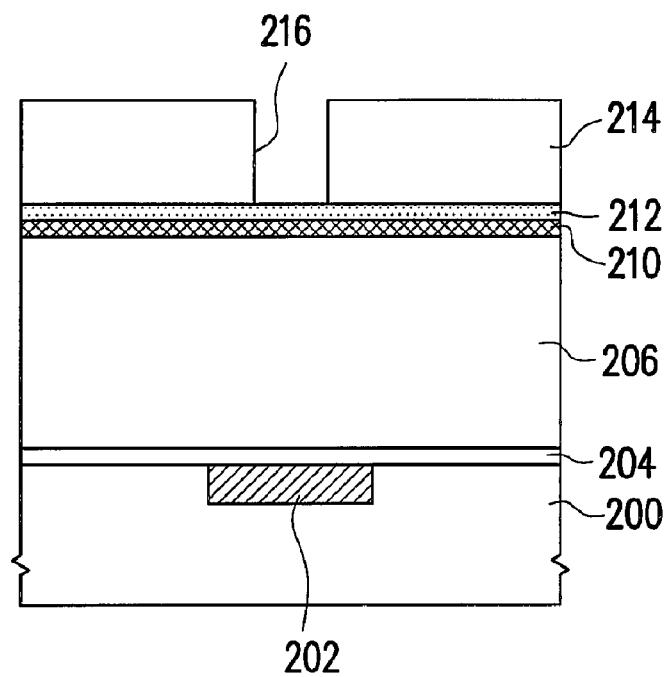
FIGS. 3A-3F illustrate, in a cross-sectional view, a process flow of fabricating a dual damascene structure according to a first embodiment of this invention.

Referring to FIG. 3A, a substrate 200 having a conductive layer 202 and a liner layer 204 thereon is provided, possibly being a semiconductor substrate like a bulk-Si substrate or an SOI substrate. The conductive layer 202 may be a metal interconnect like a Cu line. The liner layer 204 can prevent oxidation of the conductive layer 202, and may be an SiN layer. A dielectric layer 206, such as a low-k layer with a dielectric constant smaller than 4, is formed on the liner layer 204. A metal hard mask layer 210 is formed on the dielectric layer 206 through, for example, CVD or sputtering, possibly including a material selected from Ti, Ta, W, TiN, TaN, WN and their combinations and having a thickness of 50-300 Å. The thickness of the metal hard mask layer 210 is preferably just enough to avoid via-plug bridging, and the higher the etching selectivity between the dielectric layer 206 and the metal hard mask layer 210 in the dielectric etching process is, the thinner the metal hard mask layer 210 can be. In some cases, an anti-reflection coating (ARC) 212 is further formed on the metal hard mask layer 210. A patterned photoresist layer 214 is formed on the substrate 200, having a via-hole pattern 216 for forming a via hole.

Figure 3B:
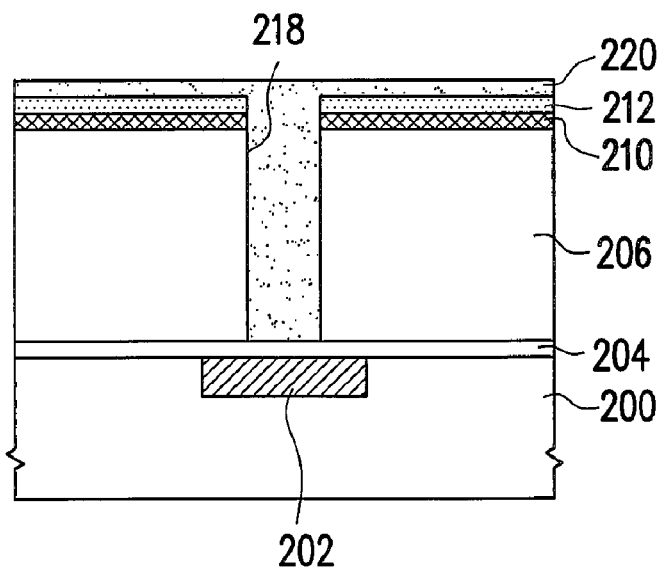

Referring to FIG. 3B, the ARC 212, the hard mask layer 210 and the dielectric layer 206 are etched with the photoresist layer 214 as a mask to form, in the dielectric layer 206, a via hole 218 exposing a portion of the liner layer 204. In an example, the ARC 212 is etched with $CF_4/O_2$ as an etching gas, the metal hard mask layer 210 etched with $Cl_2/Ar$ as an etching gas, and the dielectric layer 206 etched with $CF_4/Ar/N_2$ or $CHF_3/Ar/N_2$ as an etching gas. The photoresist layer 214 is removed, and then a gap-filling material 220 is filled in the via hole 218, possibly including a polymer like a photosensitive polymer or a non-photosensitive one and formed with spin-on coating.

Figure 3C:
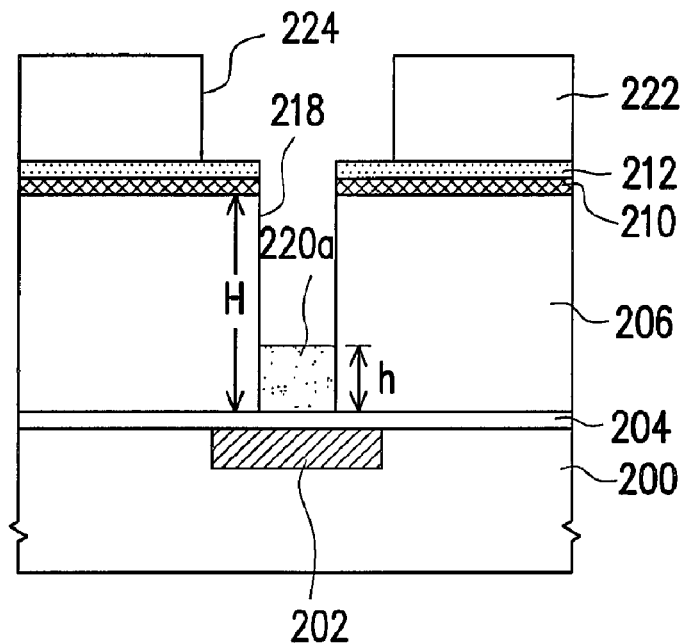

Referring to FIG. 3C, a portion of the gap-filling material 220 is removed, such that the rest of the same is retained in the via hole 218 as a gap-filling layer 220a. The gap-filling layer 220a preferably has a height "h" of ¼ to ½ of the depth "H" of the via hole 218. The portion of the gap-filling material 220 may be removed through etching-back. Another patterned photoresist layer 222 is then formed over the substrate 200, having a trench pattern 224 for forming a trench later.

Figure 3D:
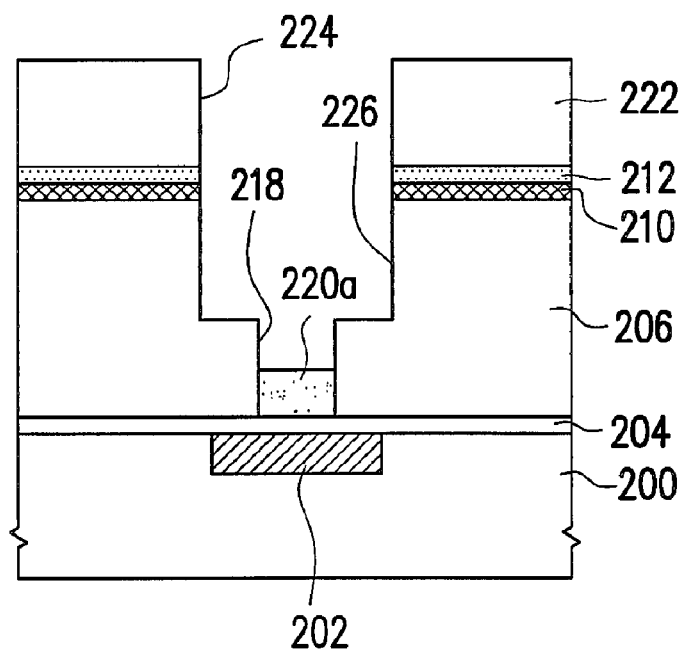

Referring to FIG. 3D, the ARC 212, the metal hard mask layer 210 and the dielectric layer 206 are etched with the patterned photoresist layer 222 as a mask to form, in the dielectric layer 206, a trench 226 connected with the via hole 218.

In an example, the ARC 212 is etched with $CF_4/O_2$ as etching gas, with etching selectivities of 10-40 and 0.5-1.5 to the metal hard mask layer 210 and the photoresist layer 222, respectively. The metal hard mask layer 210 is then etched with $Cl_2/Ar$ as an etching gas, with etching selectivities of 20-50 and 0.5-1.5 to the dielectric layer 206 and the photoresist layer 222, respectively. The dielectric layer 206 is then etched with $CF_4/Ar/N_2$ or $CHF_3/Ar/N_2$ as an etching gas, with etching selectivities of 0.5-1.5, 5-20 and 20-50 to the gap-filling layer 220a, the photoresist layer 222 and the metal hard mask layer 210, respectively. For the etching selectivity between the metal hard mask layer 210 and the dielectric layer 206 is very high, the profile of the trench 226 can be well controlled. The etchants that can be used in this invention are not limited to the aforementioned. By selecting suitable etchants, the etching selectivities between different layers can be controlled within desired ranges to improve the profile of the trench 226 as well as to reduce the micro-loading effect caused by different etching rates in dense-pattern areas and isolated-pattern areas.

Figure 4:
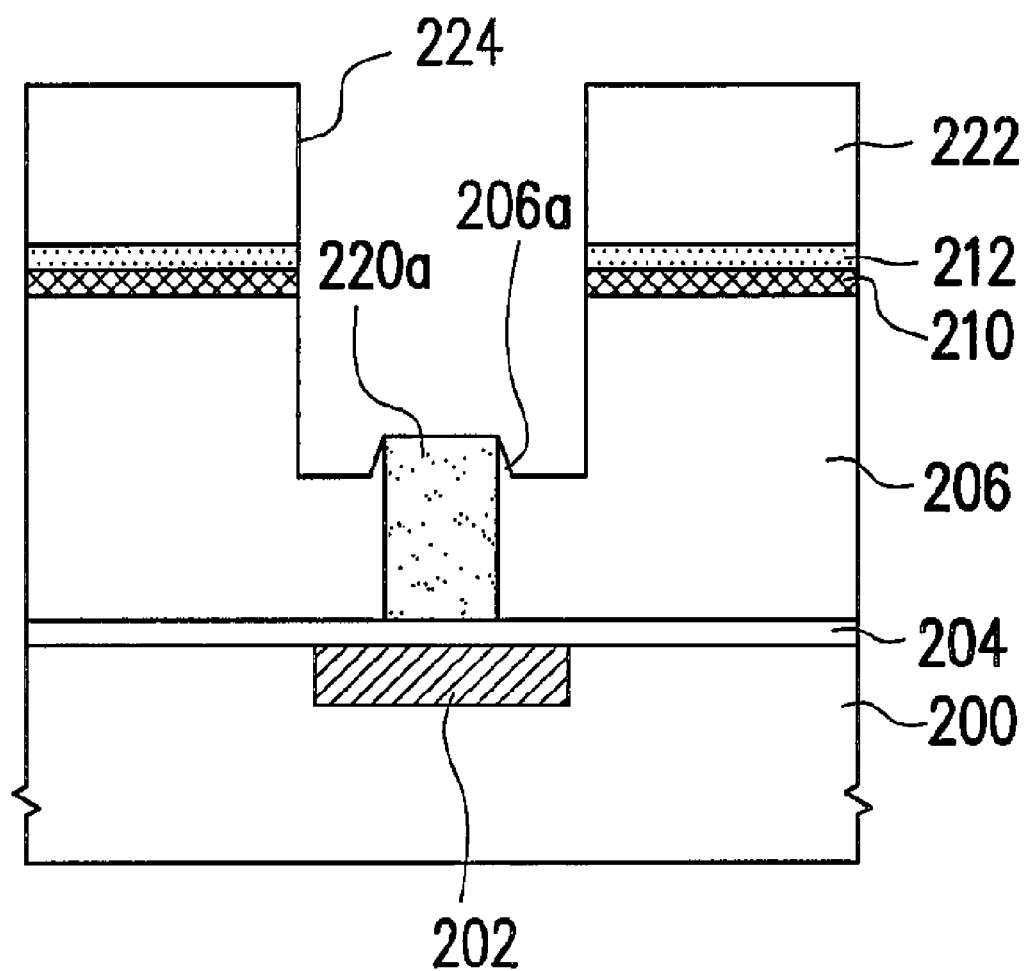
FIG. 4 illustrates the result of trench etching when the height of the gap-filling layer is larger than ½ of the depth of the via hole.

The height "h" of the gap-filling layer 220a is very important in this invention. If the height is smaller than ¼ of the depth "H" of the via hole 218, the gap-filling layer 220a will be consumed in the etching of the trench 226, so that the liner layer 204 is exposed or is even etched through to cause the conductive layer 202 to be damaged by the etchant. If the height is larger than ½ of the depth "H", a dielectric fence 206a will form on the top corner of the via hole 218 after the trench 226 is formed, as shown in FIG. 4, so that the subsequent metal filling is adversely affected.

Figure 3E:
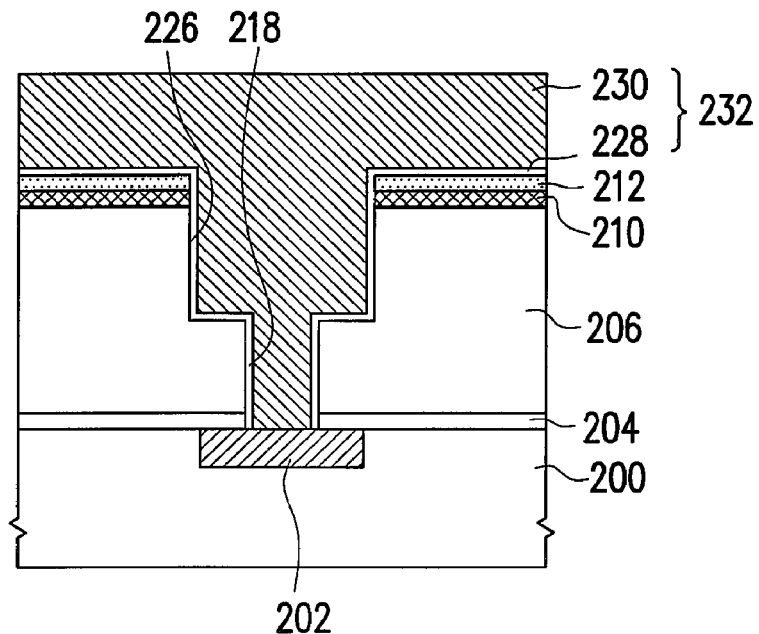

Referring to FIG. 3E, the photoresist layer 222 and the gap-filling layer 220a are removed. In some cases, the photoresist layer 222 and gap-filling layer 220a are simultaneously removed with, for example, oxygen plasma ashing. The liner layer 204 in the via hole 218 is removed, and a conductive layer 232 is formed on the substrate 200 filling in the trench 226 and the via hole 218. The layer 232 is usually formed by forming a barrier layer 228 on surfaces of the trench 226 and the via hole 218 and forming a metal layer 230 filling up 226 and 218. The material of the barrier layer 228 may be TiN or TaN, and the metal layer 230 may be a copper layer.

Figure 3F:
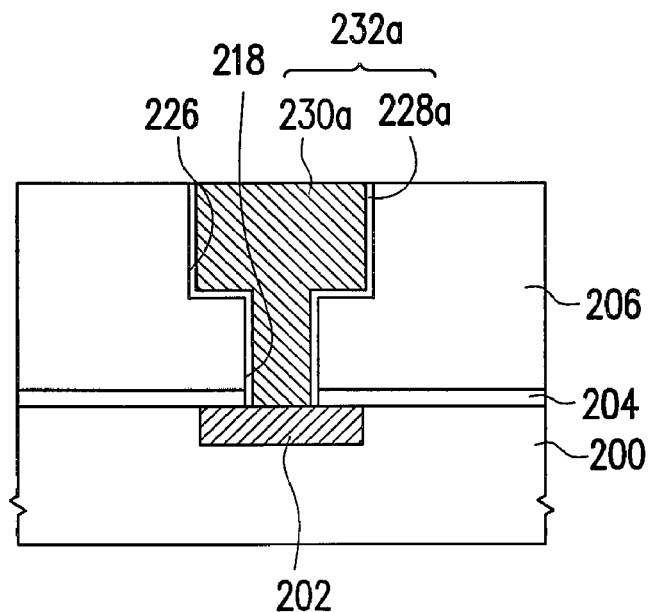

Referring to FIG. 3F, a portion of the conductive layer 232, the ARC 212 and the metal hard mask layer 210 are removed, so that a conductive layer 232a is retained in the trench 226 and the via hole 218. The removal may be done through CMP.

Second Embodiment

FIGS. 5A-5F illustrate, in a cross-sectional view, a process flow of fabricating a dual damascene structure according to the second embodiment of this invention. This process is similar to that in the first embodiment, except that after the dielectric layer is formed but before the metal hard mask layer is formed, a cap layer is formed capable of serving as a polishing stop layer in the subsequent CMP process.

Figure 5A:
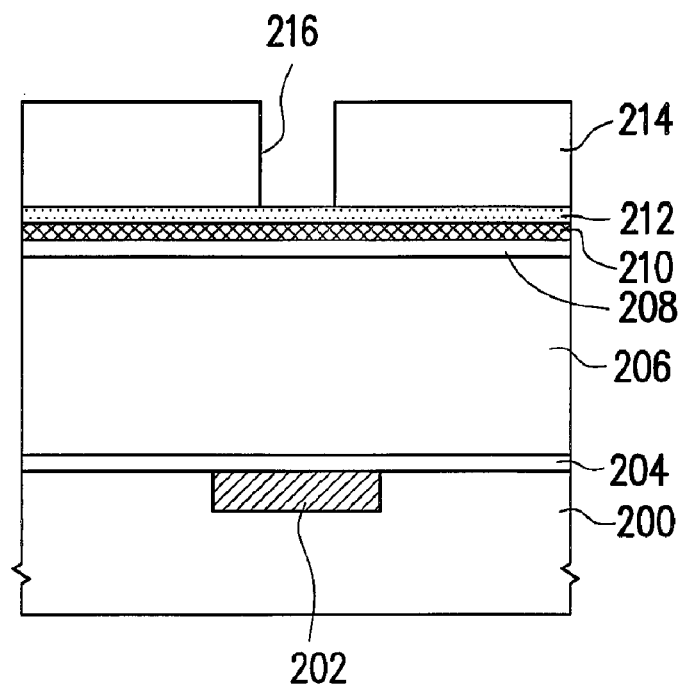
FIGS. 5A-5F illustrate, in a cross-sectional view, a process flow of fabricating a dual damascene structure according to a second embodiment of this invention.

Referring to FIG. 5A, a structure including a substrate 200, a conductive layer 202, a liner layer 204 and a dielectric layer 206 is formed as in the first embodiment, while the materials and forming methods of the layers may also be the same. A cap layer 206 is formed on the dielectric layer 206 through, for example, CVD, possibly including SiO, SiN, SiCN, SiC or SiON. A metal hard mask layer 210 is then formed on the cap layer 208, possibly in the same manner mentioned above. In some cases, an ARC 212 is further formed on the metal hard mask layer 210. A photoresist layer 214 is then formed on the substrate 200, with a via-hole pattern 216 for forming a via hole.

Figure 5B:
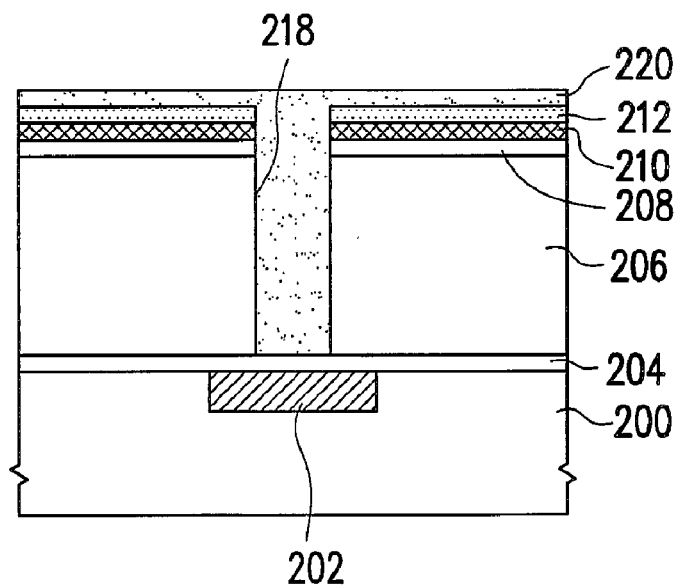

Referring to FIG. 5B, the ARC 212, the metal hard mask layer 210, the cap layer 208 and the dielectric layer 206 are etched with the photoresist layer 214 as a mask to form, in the dielectric layer 206, a via hole 218 exposing a portion of the liner layer 204. The photoresist layer 214 is removed, and a gap-filling material 220 is formed filling in the via hole 218 possibly in the same manner mentioned above.

Figure 5C:
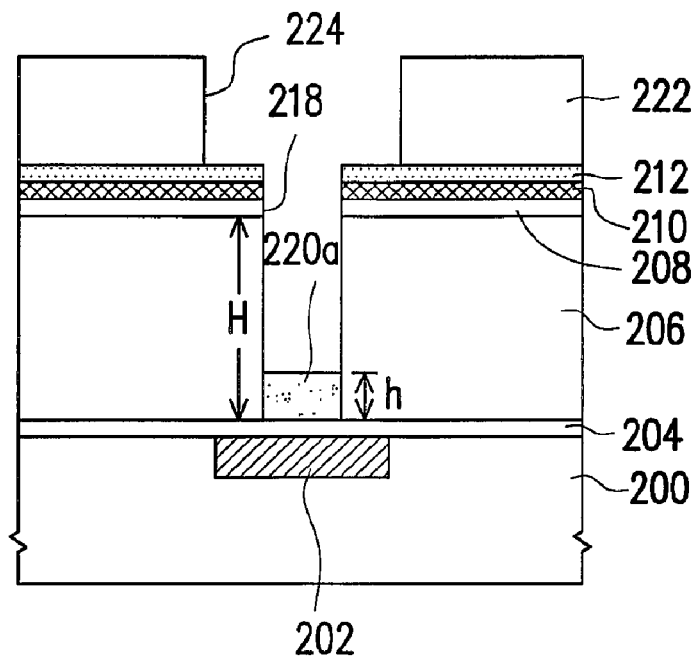

Referring to FIG. 5C, a portion of the gap-filling material 220 is removed, such that the rest of the same is retained in the via hole 218 as a gap-filling layer 220a. The gap-filling layer 220a preferably has a height "h" of ¼ to ½ of the depth "H" of the via hole 218. The portion of the gap-filling material 220 may be removed with etching-back. Another patterned photoresist layer 222 is formed over the substrate 200, having a trench pattern 224 for forming a trench in the dielectric layer 206 later.

Figure 5D:
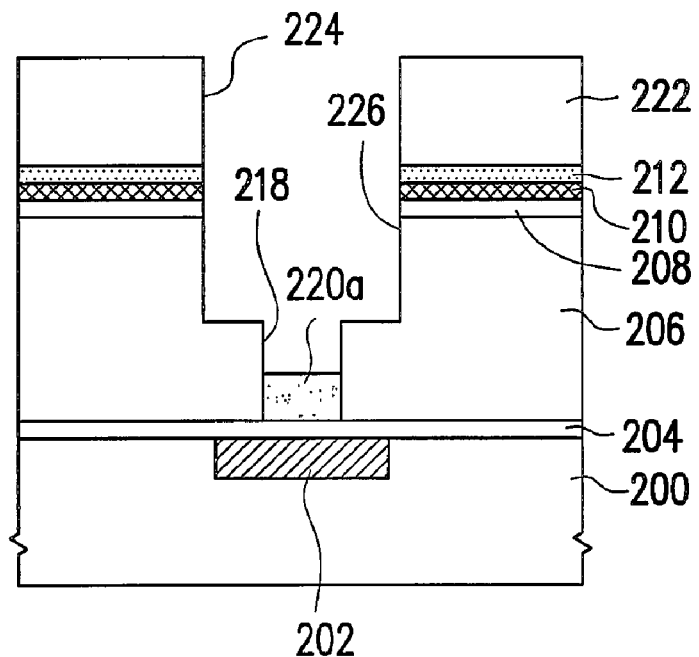

Referring to FIG. 5D, the ARC 212, the hard mask layer 210, the cap layer 208 and the dielectric layer 206 are etched with the photoresist layer 222 as a mask to form, in the dielectric layer 206, a trench 226 connected with the via hole 218. The etching selectivity of the layer 206 to the gap-filling layer 220a may range from 0.5 to 1.5.

Figure 5E:
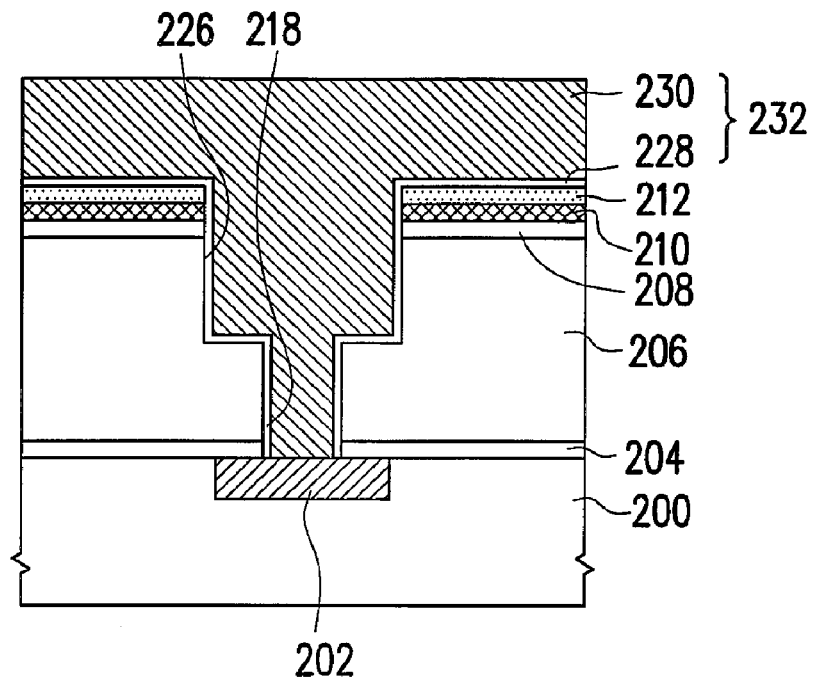

Referring to FIG. 5E, the photoresist layer 222 and the gap-filling layer 220a are removed. In some cases, the two layers 222 and 220a are simultaneously removed through, for example, oxygen plasma ashing. The liner layer 204 in the via hole 218 is then removed, and a conductive layer 232 is formed over the substrate 200 filling in the trench 226 and the via hole 218, possibly in the same manner mentioned above.

Figure 5F:
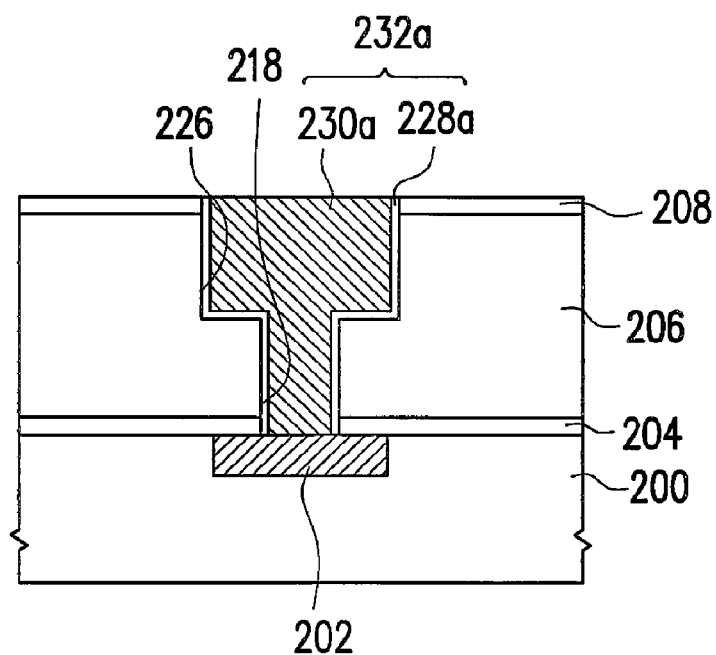

Referring to FIG. 5F, a portion of the conductive layer 232, the ARC 212 and the metal hard mask layer 210 are removed, so that a conductive layer 232a including a metal layer 230a and a barrier layer 228a is retained in the trench 226 and the via hole 218. The removal may be done through CMP, wherein the cap layer 208 can serve as a polishing stop layer to prevent over-polishing of the dielectric layer 206 caused by different polishing rates in dense-pattern areas and isolated-pattern areas.

Third Embodiment

FIGS. 6A-6F illustrate, in a cross-sectional view, a process flow of fabricating a dual damascene structure according to the third embodiment of this invention. This process is similar to that in the first embodiment, except that after the metal hard mask layer is formed but before the ARC is formed, a cap layer is formed on the metal hard mask layer to prevent the same from being exposed and causing contamination in the step of removing the liner layer exposed in the via hole.

Figure 6A:
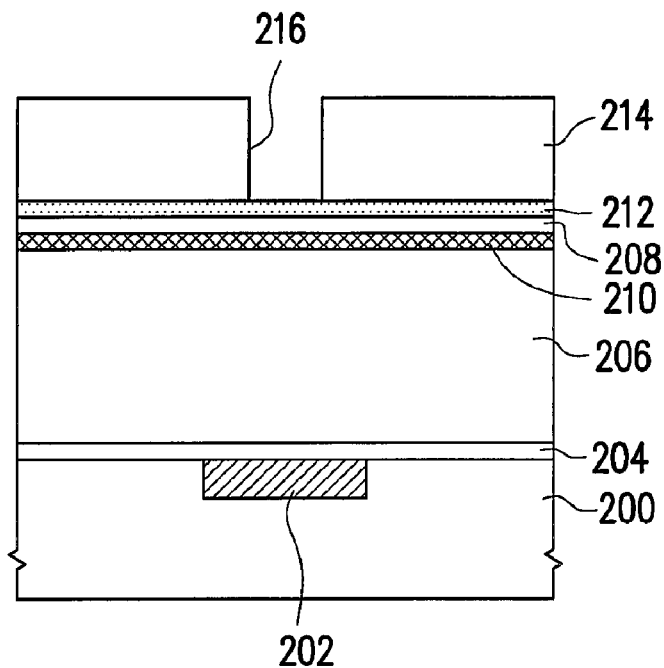
FIGS. 6A-6F illustrate, in a cross-sectional view, a process flow of fabricating a dual damascene structure according to a third embodiment of this invention.

Referring to FIG. 6A, a structure including a substrate 200, a conductive layer 202, a liner layer 204, a dielectric layer 206 and a metal hard mask layer 210 is formed as in the first embodiment, while the materials and forming methods of the layers may also be the same. A cap layer 208 is formed on the hard mask layer 210, possibly in the same manner mentioned above. In some cases, an ARC 212 is further formed on the cap layer 208. A photoresist layer 214 is then formed on the substrate 200, with a via-hole pattern 216 for forming a via hole in the dielectric layer 206 later.

Figure 6B:
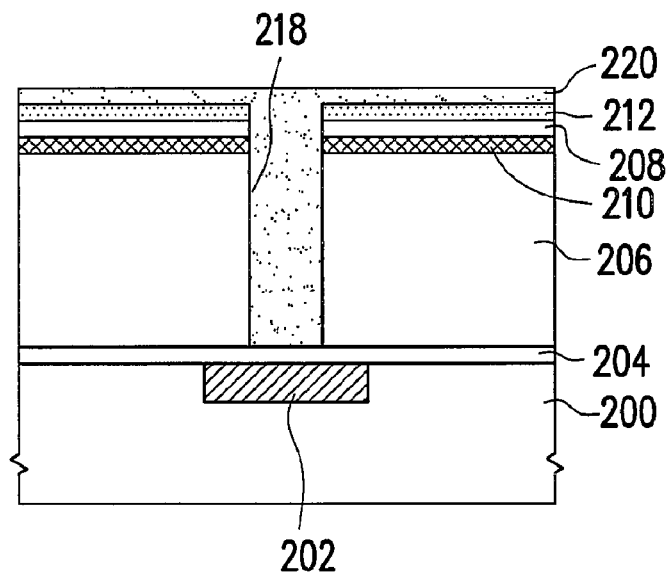

Referring to FIG. 6B, the ARC 212, the cap layer 208, the metal hard mask layer 210 and the dielectric layer 206 are etched with the photoresist layer 214 as a mask to form, in the dielectric layer 206, a via hole 218 exposing a portion of the liner layer 204. The photoresist layer 214 is removed, and a gap-filling material 220 is formed filling in the via hole 218 possibly in the same manner mentioned above.

Figure 6C:
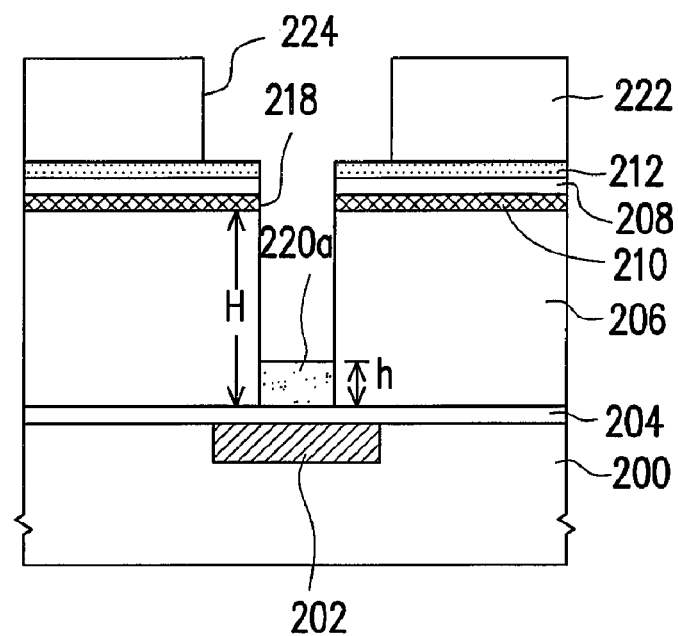

Referring to FIG. 6C, a portion of the gap-filling material 220 is removed, such that the rest of the same is retained in the via hole 218 as a gap-filling layer 220a. The gap-filling layer 220a preferably has a height "h" of ¼ to ½ of the depth "H" of the via hole 218. The portion of the gap-filling material 220 may be removed through an etching-back step. Another photoresist layer 222 is then formed over the substrate 200, having a trench pattern 224 for forming a trench in the dielectric layer 206 later.

Figure 6D:
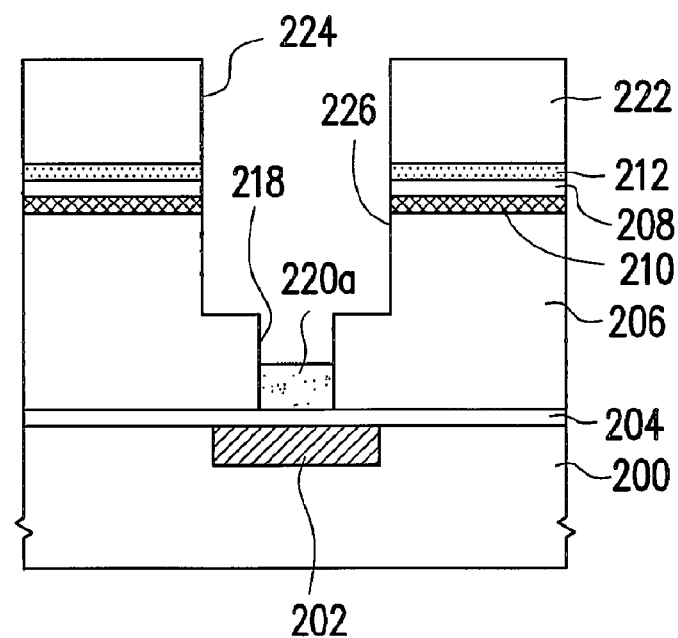

Referring to FIG. 6D, the ARC 212, the cap layer 208, the metal hard mask layer 210 and the dielectric layer 206 are etched with the photoresist layer 222 as a mask to form a trench 226 in connection with the via hole 218. The etching selectivity of the dielectric layer 206 to the gap-filling layer 220a may range from 0.5 to 1.5.

Figure 6E:
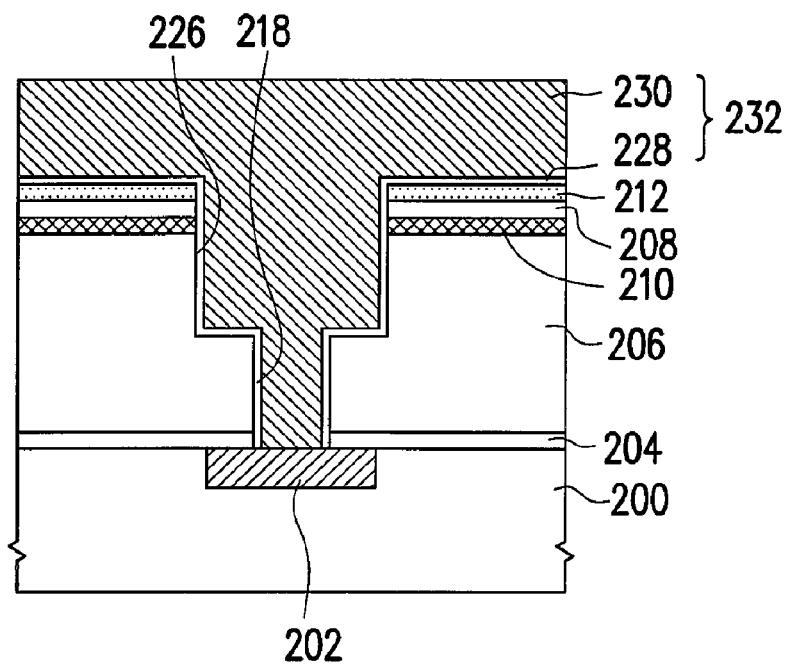

Referring to FIG. 6E, the photoresist layer 222 and the gap-filling layer 220a are removed. In some cases, the photoresist layer 222 and the gap-filling layer 220a are simultaneously removed through, for example, oxygen plasma ashing. The liner layer 204 in the via hole 218 is then removed, wherein the ARC 212 and the cap layer 208 can protect the metal hard mask layer 210 from being exposed to cause contamination. A conductive layer 232 is then formed over the substrate 200 filling in the trench 226 and the via hole 218, possibly in the same manner mentioned above.

Figure 6F:
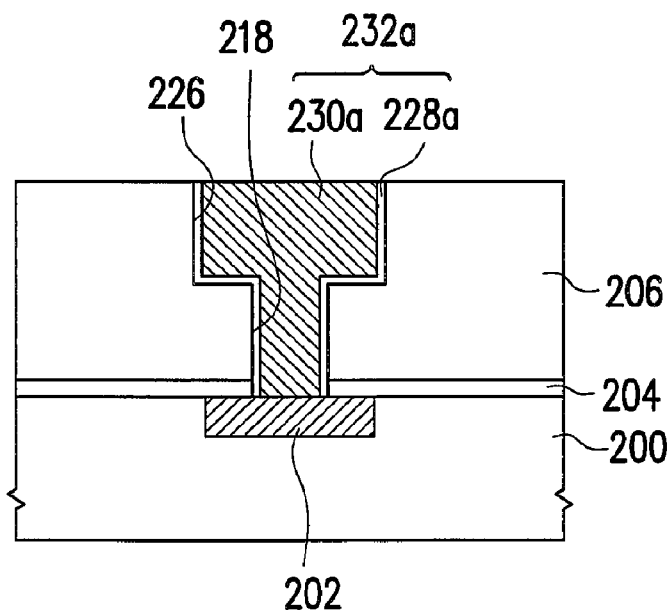

Referring to FIG. 6F, a portion of the conductive layer 232, the ARC 212, the cap layer 208 and the metal hard mask layer 210 are removed, so that a conductive layer 232a including a metal layer 230a and a barrier layer 228a is retained in the trench 226 and the via hole 218. The removal may be done through CMP.

Fourth Embodiment

FIGS. 7A-7F illustrate, in a cross-sectional view, a process flow of fabricating a dual damascene structure according to the fourth embodiment of this invention. This process is similar to that in the third embodiment, except that two cap layers are formed respectively under and on the metal hard mask layer. Hence, the process is described for only the parts relating to the metal hard mask layer and the two cap layers, while the other parts of the process can be the same as in the third embodiment.

Figure 7A:
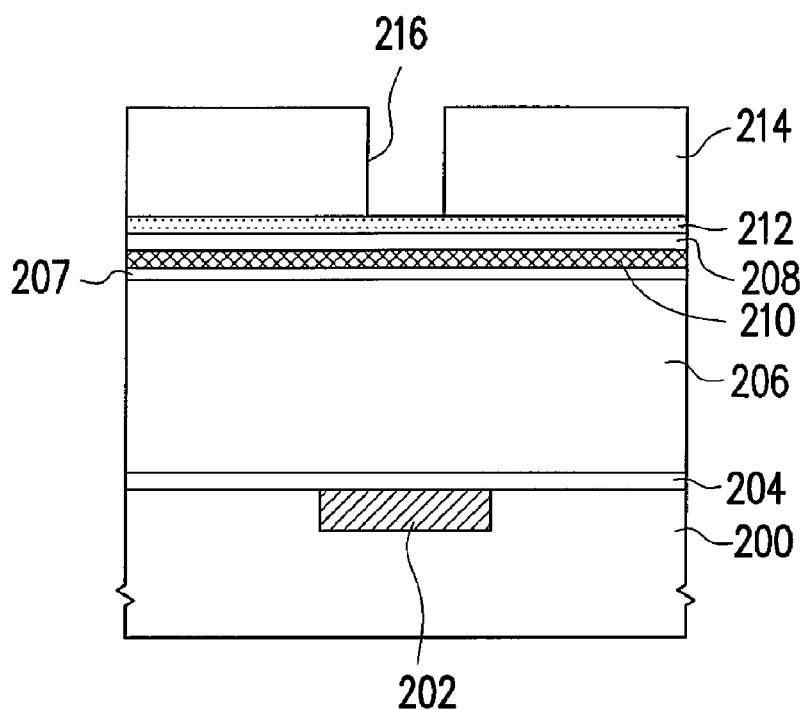
FIGS. 7A-7F illustrate, in a cross-sectional view, a process flow of fabricating a dual damascene structure according to a fourth embodiment of this invention.
Figure 7B:
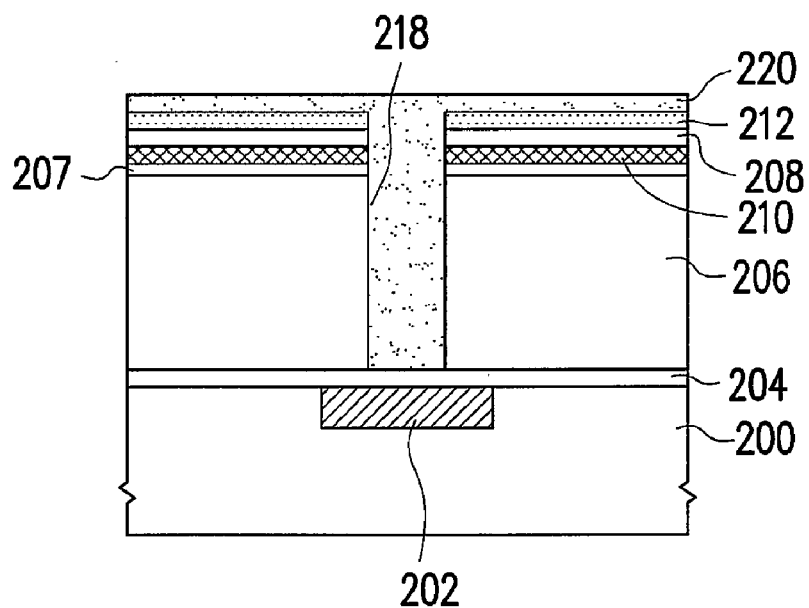
Figure 7C:
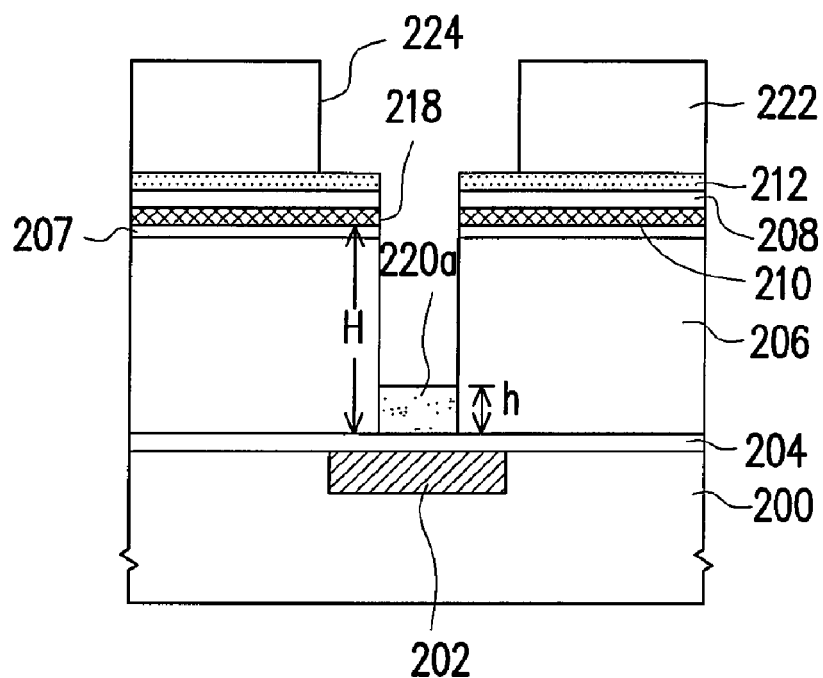
Figure 7D:
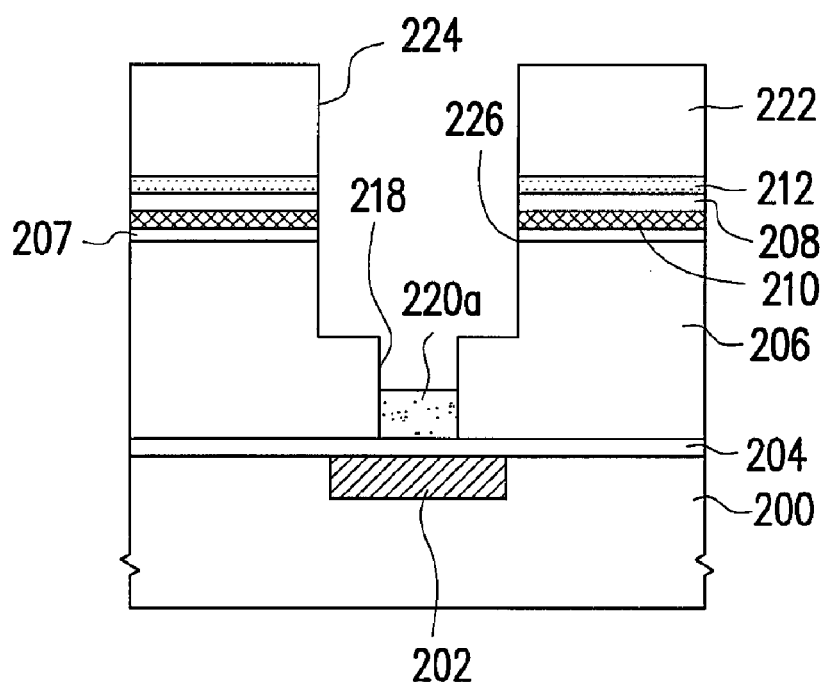

Referring to FIG. 7A, the lower cap layer 207 is formed before the metal hard mask layer 210 is formed and the upper cap layer 208 after the same is formed, wherein each of the two cap layers 207 and 208 may be formed as above. Referring to FIGS. 7A and 7B, in the etching process of the via hole 218 with the photoresist layer 214 as a mask, the cap layer 208, the metal hard mask layer 210 and the cap layer 207 are sequentially etched through. Referring to FIGS. 7C and 7D, in the etching process of the trench 226 with the photoresist layer 222 as a mask, the cap layer 208, the metal hard mask layer 210 and the cap layer 207 are also sequentially etched.

Figure 7E:
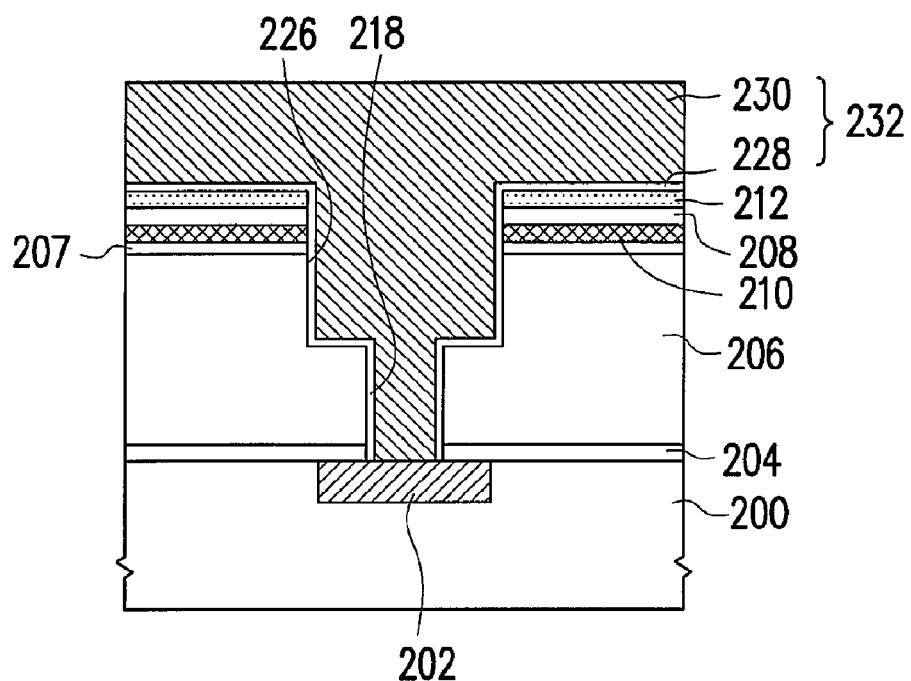
Figure 7F:
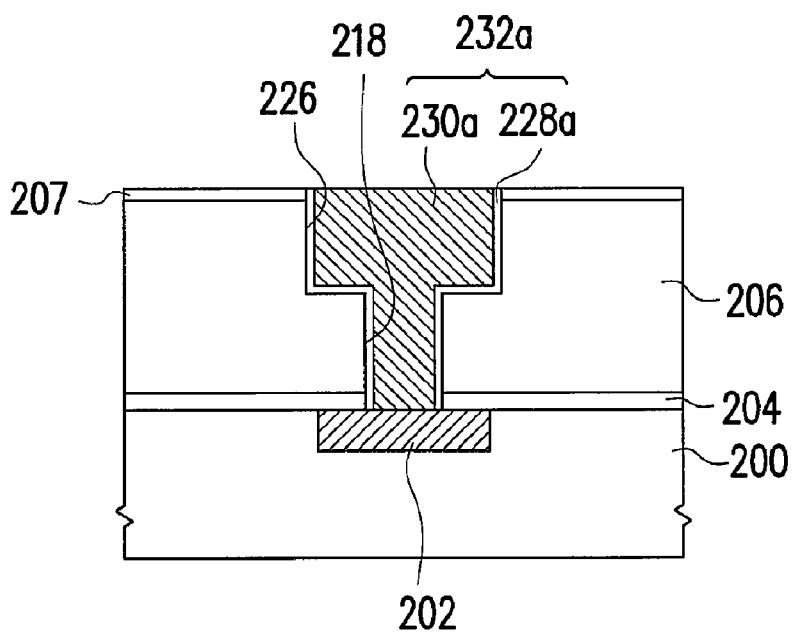

Referring to FIG. 7E, in the later step of removing the liner layer 204 exposed in the via hole 218, the ARC 212 and the cap layer 208 can protect the metal hard mask layer 210 from being exposed to cause contamination. Referring to FIGS. 7E and 7F, in a case where a portion of the conductive layer 232, the ARC 212, the cap layer 208 and the metal hard mask layer 210 are removed through CMP in the subsequent process, the cap layer 207 can serve as a polishing stop layer to prevent over-polishing of the dielectric layer 206 resulting from different polishing rates in dense-pattern areas and isolated-pattern areas.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of fabricating a dual damascene structure, comprising:
    providing a substrate having a conductive layer and a liner layer thereon;
    forming a dielectric layer on the liner layer;
    forming a metal hard mask layer on the dielectric layer;
    forming an antireflection layer on the metal hard mask layer;
    patterning the antireflection layer, the metal hard mask layer and the dielectric layer to form, in the dielectric layer, a via hole that exposes a portion of the liner layer;
    filling in the via hole a gap-filling layer and conducting an etching-back process to remove a portion of the gap-filling layer, such that a remaining gap-filling layer has a height of ¼ to ½ of a depth of the via hole
    patterning the antireflection layer, the metal hard mask layer and the dielectric layer to form a trench connected with the via hole;
    removing the remaining gap-filling layer;
    removing the liner layer in the via hole with the dielectric layer as a mask;
    forming a metal layer filling in the trench and the via hole; and
    removing the antireflection layer and the metal hard mask layer.

2. The method of claim 1, wherein the gap-filling layer comprises a photosensitive polymer or a non-photosensitive polymer.

3. The method of claim 1, wherein the steps of forming the trench and removing the remaining gap-filling layer comprise:
    forming on the antireflection layer a patterned photoresist layer having a trench pattern;
    etching the antireflection layer, the metal hard mask layer and the dielectric layer with the patterned photoresist layer as a mask to form the trench; and
    removing the remaining gap-filling layer and the photoresist layer simultaneously.

4. The method of claim 3, wherein in the step of etching the antireflection layer, the metal hard mask layer and the dielectric layer, an etching selectivity of the dielectric layer to the remaining gap-filling layer ranges from 0.5 to 1.5 as the dielectric layer is being etched.

5. The method of claim 3, wherein the step of removing the remaining gap-filling layer and the photoresist layer simultaneously comprises an oxygen-plasma ashing step.

6. The method of claim 1, wherein the metal hard mask layer comprises a material selected from Ti, Ta, W, TiN, TaN, WN and their combinations.

* * * * *